United States Patent
Liu et al.

(10) Patent No.: US 10,446,642 B2
(45) Date of Patent: Oct. 15, 2019

(54) EPITAXIAL SUBSTRATE AND METHOD FOR FORMING THE SAME

(71) Applicant: GLOBALWAFERS CO., LTD., Hsinchu (TW)

(72) Inventors: Che-Ming Liu, Hsinchu (TW);
Man-Hsuan Lin, Hsinchu (TW);
Chih-Yuan Chuang, Hsinchu (TW);
Shuo-Hung Hsu, Hsinchu (TW);
Chuan-Wei Tsou, Hsinchu (TW);
Wen-Ching Hsu, Hsinchu (TW)

(73) Assignee: GLOBALWAFERS CO., LTD., Hsinchu (TW)

( * ) Notice: Subject to any disclaimer, the term of this patent is extended or adjusted under 35 U.S.C. 154(b) by 0 days.

(21) Appl. No.: 15/934,032

(22) Filed: Mar. 23, 2018

(65) Prior Publication Data
US 2018/0315815 A1  Nov. 1, 2018

(30) Foreign Application Priority Data

Apr. 28, 2017 (TW) .............................. 106114175 A
Jan. 8, 2018 (TW) .............................. 107100681 A

(51) Int. Cl.
*H01L 29/06* (2006.01)
*C30B 29/40* (2006.01)
*H01L 21/02* (2006.01)
*C30B 25/18* (2006.01)
*H01L 29/20* (2006.01)

(52) U.S. Cl.
CPC ........ *H01L 29/0638* (2013.01); *C30B 25/183* (2013.01); *C30B 29/403* (2013.01); *H01L 21/0245* (2013.01); *H01L 21/0254* (2013.01); *H01L 21/0262* (2013.01); *H01L 21/02381* (2013.01); *H01L 21/02458* (2013.01); *H01L 21/02502* (2013.01); *H01L 29/2003* (2013.01); *H01L 21/0251* (2013.01)

(58) Field of Classification Search
CPC .......... H01L 29/0638; H01L 21/02502; H01L 21/0254; H01L 21/0251
See application file for complete search history.

(56) References Cited

U.S. PATENT DOCUMENTS

| | | | |
|---|---|---|---|
| 2013/0069208 A1* | 3/2013 | Briere | ................. H01L 21/0237 257/655 |
| 2015/0236121 A1* | 8/2015 | Chiu | ................. H01L 29/66462 257/194 |
| 2018/0247809 A1* | 8/2018 | Ichimura | ................. C23C 16/34 |

* cited by examiner

*Primary Examiner* — Sonya D. McCall-Shepard
(74) *Attorney, Agent, or Firm* — R. Lynette Wylie; Apex Juris, Pllc.

(57) ABSTRACT

An epitaxial substrate and a method for forming the same are disclosed. The epitaxial substrate includes a substrate, a deposition layer, a buffer layer and an epitaxial layer. The deposition layer is directly formed on the substrate, wherein the deposition layer includes a gradient doping concentration, and has a first surface and a second surface which are opposite to each other; the gradient doping concentration has a minimum value at the first surface. The buffer layer is formed on the deposition layer, and an epitaxial layer is formed on the buffer layer. The epitaxial layer is mainly formed of group III-V nitride. The substrate and the deposition layer are formed of homogeneous material. Since the deposition layer is directly formed on the substrate, and the deposition layer and the substrate are formed of a homogeneous material, the epitaxial substrate includes a good heat dissipation efficiency and low leakage current.

23 Claims, 2 Drawing Sheets

EPITAXIAL SUBSTRATE AND METHOD FOR FORMING THE SAME

BACKGROUND OF THE INVENTION

1. Technical Field

The present invention is related to semiconductor substrates, and more particularly related to an epitaxial substrate and a method for forming the same.

2. Description of Related Art

For conventional semiconductor manufacturing process, an epitaxial layer is grown on a surface of a SiC or sapphire substrate, and then a semiconductor device or a circuit is formed on the epitaxial layer.

To meet the requirement for the high-power and high-frequency semiconductor applications, it is necessary for the semiconductor devices to be able to sustain a higher breakdown voltage and to reduce the leakage current from the substrate as much as possible. For instance, the introduction of SOI wafer (Silicon on insulator wafer) is to reduce the leakage current from the substrate. In conventional SOI substrates, an oxide layer (e.g. $SiO_2$) is usually added into two silicon substrates to be used as an insulator and a bonding layer. However, it is known that the oxide layer is a bad heat conductor. Therefore, it is frequently seen that the SOI substrate made by the conventional SOI process usually includes a drawback of low heat dissipation efficiency.

In addition, for different application purpose, the requirements of the heat dissipation performance, thermal endurance for the substrate could be different. For instance, for RF devices, since an operation temperature thereof is as high as 400° C., the operation performance of the RF devices would be affected if the heat dissipation efficiency of the substrate is bad.

Hence, it is still a need to provide a substrate which could have a strong strength, low leakage current, thermally stable at a high temperature, and good heat dissipation performance.

BRIEF SUMMARY OF THE INVENTION

In view of the above, an object of the present invention is to provide an epitaxial substrate which could be thermally stable at a high temperature and has a low leakage current.

The present invention provides an epitaxial substrate, including a substrate; a deposition layer formed on the substrate directly, wherein the deposition layer includes a gradient doping concentration, and has a first surface and a second surface which are opposite to each other; the gradient doping concentration has a minimum value at the first surface; a buffer layer formed on the deposition layer; and an epitaxial layer formed on the buffer layer, and the epitaxial layer is mainly formed of group III-V nitride; wherein, the substrate and the deposition layer are formed of homogeneous material.

The present invention also provides a method for forming an epitaxial substrate, including steps of providing a substrate; forming a deposition layer on the substrate, wherein the deposition layer and the substrate are formed of homogeneous material; the deposition layer includes a gradient doping concentration and has a first surface and a second surface which are opposite to each other; the gradient doping concentration has a minimum value at the first surface; the deposition layer includes a gradient resistivity which includes a high impedance layer region having a resistivity at least greater than 1500 ohm-cm; forming a buffer layer on the deposition layer; and forming an epitaxial layer on the buffer layer, wherein the epitaxial layer is mainly formed of group III-V nitride.

The advantage of the present invention is that since the deposition layer is directly formed on the substrate, and the deposition layer and the substrate are formed of a homogeneous material, whereby the epitaxial substrate could include a good heat dissipation efficiency and low leakage current.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
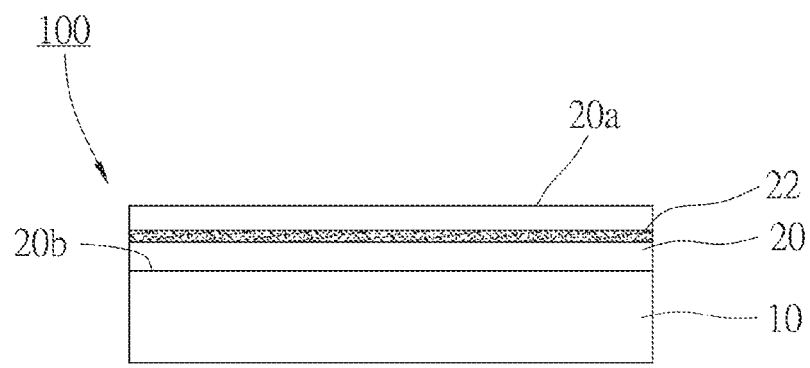
FIG. 1 to FIG. 2 are cross-sectional views of an epitaxial substrate according to a first embodiment of the present invention.
Figure 2:
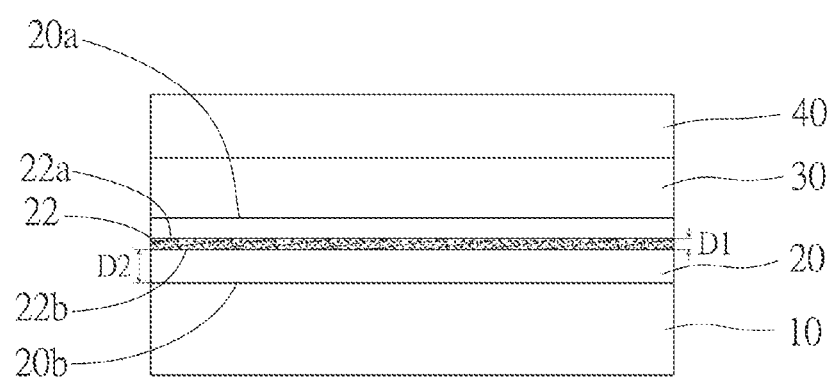

The present invention will now be described in detail with reference to an embodiment thereof as illustrated in the accompanying drawings. As illustrated in FIG. 1 and FIG. 2, an epitaxial substrate 100 of a first embodiment according to the present invention includes a substrate 10, a deposition layer 20, a buffer layer 30, and an epitaxial layer 40, wherein a method for forming the epitaxial substrate 100 of the embodiment would be described hereinafter.

First, step A is performed: providing a substrate. Wherein, in the current embodiment, the substrate 10 is a silicon substrate, and preferably, a heavily doped silicon substrate as an example; the substrate 10 includes a substrate doping concentration, wherein the substrate doping concentration is equal to or greater than $1\times10^{18}$ atom/$cm^3$. The substrate 10 could be doped with a donor dopants or acceptor dopants, such as Boron (B), Aluminum (Al), Gallium (Ga), Phosphorus (P), Arsenic (As), Antimony (Sb) or a combination thereof, although this is not a limitation to other practical applications. Then, step B is performed: forming a deposition layer on the substrate, wherein the deposition layer and the substrate are of the same material. Wherein, the deposition layer includes a gradient doping concentration and has a first surface and a second surface which is opposite to the first surface; a minimum value of the gradient doping concentration is formed at the first surface.

For instance, in the current embodiment, the deposition layer 20 is directly deposited on substrate 10 through an MOCVD process to form a homogeneous layer with the Silicon substrate. Wherein, the doping concentration of the deposition layer 20 is lower than a doping concentration of the substrate 10; the deposition layer 20 is formed of a lightly doped or undoped, pure single crystal silicon. For instance, the deposition layer 20 is lightly doped with a dopant selected from the same dopant or a different dopant from that of the first substrate 10. The deposition layer 20 includes a first surface 20a and a second surface 20b, wherein the deposition layer 20 is directly connected to the substrate 10 via the second surface 20b. During the high-temperature annealing process, the lightly doped dopants of the deposition layer 20 would be heated to diffuse and form a gradient doping concentration. In another embodiment, the dopants of the heavily doped substrate 10 could diffuse into the undoped deposition layer during the high-temperature thermal treatment, thereby forming a gradient doped concentration. In addition, the gradient doping concentration deposition layer 20 decreases toward a direction away from the substrate 10, wherein the gradient doping concentration includes a minimum value at the first surface 20a, and the gradient doping concentration includes a maximum value at the second surface 20b. It is worth mentioning that, the difference and the similarities of the selected dopants could include, but not limited to, different kinds of the dopants, different types of conductivity, different dopant concentrations, etc.

Also, the deposition layer 20 includes a gradient resistivity, wherein the gradient resistivity includes a maximum value at the first surface 20a of the deposition layer 20, for example, the resistivity of the deposition layer 20 increases from the second surface 20b to the first surface 20a. Particularly, in the gradient distribution of the resistivity, the deposition layer 20 includes an impedance layer region 22 which has a resistivity at least greater than 1500 ohm-cm, and preferably, greater than 7000 ohm-cm, wherein a thickness of the high impedance layer region is smaller than or equal to 6 µm, and preferably, smaller than 2 µm.

In addition, the method for forming the deposition layer 20 not only could include an epitaxial growth method (e.g. CVD, or MOCVD process), but also includes sputtering deposition or directly bonding. The MOCVD process is not a limitation of the present invention.

Next, step C is performed: forming a buffer layer on the deposition layer. For instance, in the current embodiment, a buffer layer 30 is formed on the first surface 20a of the deposition layer, wherein the buffer layer 30 is mainly formed of Aluminum gallium nitride ($Al_xGa_{1-x}N$, wherein $0 \leq x < 1$), although this is not a limitation of the present invention. In other embodiments, the buffer layer 30 also could be formed of other materials.

Then, step D is performed: forming an epitaxial layer on the buffer layer, wherein the epitaxial layer is mainly formed of group III-V nitride. For instance, in the current embodiment, an epitaxial layer 40 is formed the buffer layer 30 by epitaxial growth, wherein the epitaxial layer 40 is mainly formed of GaN. The buffer layer 30 is adapted to buffer the epitaxial layer 40 and the deposition layer 20 to reduce a lattice defect density and increase a strain compensation of lattice matching.

Whereby, with the characteristic of the high resistivity of the high impedance layer region 22 in the deposition layer could effectively prevent the electric current which is produced in the forming steps of the semiconductor devices or circuits from flowing through deposition layer 20 to reduce leakage current during the following MOCVD process for epitaxial growth or device manufacturing process.

Furthermore, since the substrate 10 and the deposition layer 20 are directly connected to each other and formed of homogeneous material without a heterogeneous structure therebetween. Hence, the substrate of the present invention includes a better heat dissipation efficiency which is more suitable for operating in a high-temperature environment as compared to the conventional structure which includes an oxide layer formed between two substrates or the substrate and the epitaxial structure.

The following table illustrates the experiment parameters and the experimental data of the epitaxial substrate which is formed by the method of the above embodiment. Wherein, a thickness of the high impedance layer region is defined as a first distance D1 which is substantially a vertical distance between a third surface 22a to a fourth surface 22b; a diffusion depth of the high impedance layer region is defined as a second distance D2 which is substantially a vertical distance between the fourth surface 22b to the second surface 20b.

Wherein, the substrates of Experiment 1 and Experiment 2 are both selected from silicon substrates which are doped with P+ dopants, such as Boron; the silicon substrates all include a doping concentration greater than $1 \times 10^{19}$ atom/$cm^3$, a resistivity of about 0.0035 ohm-cm, and a thickness of the silicon substrate is about 1000 am.

The deposition layers of Experiment 1 and Experiment 2 are formed of a silicon deposition layer which is homogeneous with the silicon substrate, wherein the deposition layer is doped with N− dopants, such as phosphorus, and includes a thickness of about 25 am; all of the deposition layers are formed by an epitaxial process at a temperature of about 1150° C. for 310 sec. Wherein, the difference of the deposition layers of Experiment 1 and Experiment 2 is that a doping concentration of the deposition layer of Experiment 1 is about 5000 ohm-cm, and a doping concentration of the deposition layer of Experiment 2 is about 10000 ohm-cm.

The epitaxial layer of Experiment 1 and Experiment 2 is mainly formed of GaN, which is formed on the deposition layer by an epitaxial process at a temperature of about 1000° C. for 6 hr. By utilizing the deposition layers having different resistivities, the high impedance layer region of Experiment 1 has a diffusion depth of about 1.82 µm, a thickness which is smaller than 2 µm, and a resistivity which is greater than 7000 ohm-cm; the high impedance layer region of Experiment 2 has a diffusion depth of about 1.86 µm, a thickness which is smaller than 2 am, and a resistivity which is greater than 15000 ohm-cm.

From the above experiment results, the method of the present invention could provide an epitaxial substrate including a high impedance layer region with a high resistivity. For example, each of the high impedance layer regions obtained in Experiment 1 and Experiment 2 includes a thickness which is smaller than 2 am, a resistivity which is greater than 7000 ohm-cm or 15000 ohm-cm. With the high resistivity of the high impedance layer region, it could prevent the electric current which is produced in the forming steps of the semiconductor devices or circuits from flowing through deposition layer to reduce leakage current in the following process. In addition, since the substrate and the deposition layer are formed of a homogeneous material in an epitaxial process, the performance of the heat dissipation of the substrate could be further improved, which enables a broader range of applications.

|  |  | Experiment 1 | Experiment 2 |
| --- | --- | --- | --- |
| Silicon substrate | Concentration | >1E19 (atom/$cm^3$) | >1E19 (atom/$cm^3$) |
|  | Resistivity | 0.0035 (ohm-cm) | 0.0035 (ohm-cm) |
|  | Thickness | 1000 (µm) | 1000 (µm) |
|  | Dopant | P+, such as Boron | P+, such as Boron |
| Deposition layer (Si-epi) | Concentration | <1E12 (atom/$cm^3$) | <1E12 (atom/$cm^3$) |
|  | Resistivity | 5000 (ohm-cm) | 10000 (ohm-cm) |
|  | Thickness | 25 (µm) | 25 (µm) |
|  | Dopant | N−, such as Phosphorus | N−, such as Phosphorus |
|  | Process | 1150° C./310 sec | 1150° C./310 sec |
| Epitaxial layer (GaN) | Process | 1000° C./6 hr | 1000° C./6 hr |
| High | Diffusion | 1.82 (µm) | 1.86 (µm) |

-continued

|  |  | Experiment 1 | Experiment 2 |
|---|---|---|---|
| impedance layer region | Depth Thickness Resistivity | <2 (μm) >7000 (ohm-cm) | <2 (μm) >15000 (ohm-cm) |

Figure 3:
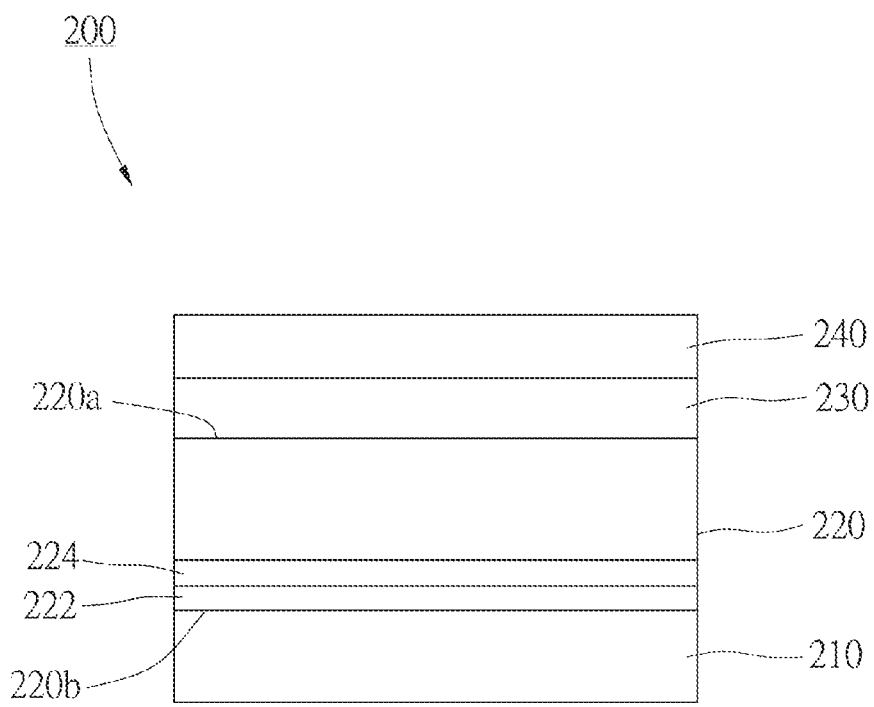
FIG. 3 is a cross-sectional view of an epitaxial substrate according to a second embodiment of the present invention.

FIG. 3 illustrates an epitaxial substrate 200 of a second embodiment according to the present invention, wherein the epitaxial substrate 200 includes a structure and a forming method which are similar to those of the epitaxial substrate 100 of the above embodiment. The epitaxial substrate 200 also includes a substrate 210, a deposition layer 220, a buffer layer 230 and an epitaxial layer 240.

Wherein, the substrate 210 is a heavily-doped p-type silicon substrate as an example, which includes a substrate doping concentration; preferably, the substrate doping concentration is equal to or greater than $1\times10^{18}$ atom/cm$^3$. In the current embodiment, the substrate 210 could be doped with a donor dopant or an acceptor dopant, such as Boron (B), Aluminum (Al), Gallium (Ga), Phosphorus (P), Arsenic (As), Antimony (Sb) or a combination thereof, although this is not a limitation of other practical applications.

The deposition layer 220 is directly formed on the substrate 210. For instance, the deposition layer 220 could be formed by an epitaxial growth method (e.g. CVD, or MOCVD process), but also includes sputtering deposition or directly bonding, although this is not a limitation to other practical applications.

Especially, the deposition layer 220 is a stacked-layer structure, which at least includes a first stacked layer 222 and a second stacked layer 224. Wherein, in one embodiment, a method of forming the stacked-layer structure includes forming the first stacked layer 222 on a surface of the substrate 210, and then forming the second stacked layer 224 on the first stacked layer 222 such that the first stacked layer 222 is on the substrate 210 and is disposed between the substrate 210 and the second stacked layer 224; the dopants of the first stacked layer 222 and the substrate 210 could be the same or different, for example, in the current embodiment, the dopants of the first stacked layer 222 and the substrate 210 are different; the dopants of the second stacked layer 224 and the first stacked layer 222 could be the same or different, for example, in the current embodiment, the dopants of the second stacked layer 224 and the first stacked layer 222 are different. The first stacked layer 222 and the second stacked layer 224 include the dopants and the doping concentration which are chosen to be utilized as a diffusion barrier layer, i.e., could control the diffusion rate of the dopant ions and prevent the dopants of the heavily doped substrate 210 from diffusing into the high impedance layer region.

The deposition layer 220 includes a first surface 220a and a second surface 220b which are opposite to each other, wherein the gradient doping concentration of the deposition layer 220 has a minimum value at the first surface 220a; on the other hand, the deposition layer 220 includes a gradient resistivity which has a maximum value at the first surface 220a of the deposition layer 220, and the gradient resistivity decreases toward the second surface 220b. It is worth mentioning that the deposition layer 220 includes an impedance layer region which has a resistivity at least greater than 1500 ohm-cm, wherein the high impedance layer region could be formed in any region of the deposition layer 220. Meanwhile, the deposition layer 220 is a stacked layer structure having multiple layers, while the first stacked layer 222 and the second stacked layer 224 also could be alternately stacked to form the multiple layers depending on the different requirement of the devices. The stacked layer structure could be adapted to control ion diffusion rate. Hence, in practice, the ion diffusion rate could be controlled by adjusting the number of layers, the thickness and the dopants of the stacked layer structure, and thereby to modify a forming region of the high impedance layer region.

Next, a buffer layer 230 is formed on the deposition layer 220 by an epitaxial growth method. In the current embodiment, the buffer layer 230 is mainly formed of Aluminum gallium nitride ($Al_xGa_{1-x}N$, wherein $0 \leq x < 1$), although this is not a limitation of the present invention. In other embodiments, the buffer layer 230 also could be formed of other materials.

Then, an epitaxial layer 240 is further formed on the buffer layer 230 by the epitaxial process. Wherein, the epitaxial layer 240 is mainly formed of group III-V nitride. For instance, in the current embodiment, the epitaxial layer 40 is mainly formed of GaN. The buffer layer 230 is adapted to buffer the epitaxial layer 240 and high impedance layer 224 to reduce a lattice defect density and increase a strain compensation of lattice matching.

With the high resistivity of the deposition layer region 220, especially the high resistivity of the high impedance layer region, the epitaxial substrate 200 could avoid the electric current which is produced in the forming steps of the semiconductor devices or circuits from flowing through the impedance layer region to reduce leakage current in the following process, such as the epitaxial growth process of CVD or MOCVD, or other process. In addition, since the epitaxial substrate of the current embodiment is also thermally stable at a high temperature, not easy to deform and good heat dissipation efficiency, whereby the epitaxial substrate of the current embodiment is especially suitable for operating in a high-temperature environment.

Wherein, the substrate is a p-type doped silicon substrate as an example, however, the substrate also could be n-type doped silicon substrate in other embodiments; the substrate could be doped with a donor dopant or an acceptor dopant, such as Boron (B), Aluminum (Al), Gallium (Ga), Phosphorus (P), Arsenic (As), Antimony (Sb) or a combination thereof, although this is not a limitation of other practical applications. In addition, when the n-type doped substrate is utilized, the dopants of the barrier layer could be replaced with n-type dopants, and are limited to the p-type dopants.

The above description is related to some embodiments of the present application only. It is worth mentioning that the material of the substrate and the deposition layer could be selected according to the lattice matching between the substrate and the deposition layer, and are not limited to the silicon substrates and the silicon deposition layer. In some embodiments, the material of the substrate and the deposition layer includes single crystal, polycrystal and amorphous material; in some embodiments, the material of the substrate and the deposition layer includes SiC, GaAs, GaP, InP, InAs, and/or InSb, etc.; in some embodiments, the material of the substrate and the deposition layer includes SiGe, GaAsP, AlInAs, AlGaAs, GaInAs, GaInP and/or GaInAsP, etc.; other suitable materials also could be utilized.

In addition, in embodiments, the substrate and the deposition layer could be selected from sapphire, GaO, LiGaO, LiAlO, Spinel, Ge, Glass, $ZrB_2$, $ScALMgO_4$, $SrCu_2O_2$, $LiGaO_2$, $LiAlO_2$, YSZ (Yttria-Stabilized Zirconia), or other suitable material.

It must be pointed out that the embodiments described above are only some embodiments of the present invention.

All equivalent structures which employ the concepts disclosed in this specification and the appended claims should fall within the scope of the present invention.

What is claimed is:

1. An epitaxial substrate, comprising:
    a substrate;
    a deposition layer formed on the substrate directly, wherein the deposition layer includes a gradient doping concentration, and has a first surface and a second surface which are opposite to each other; the gradient doping concentration has a minimum value at the first surface;
    a buffer layer formed on the deposition layer; and
    an epitaxial layer formed on the buffer layer, and the epitaxial layer is mainly formed of group III-V nitride; wherein, the substrate and the deposition layer are formed of homogeneous material; the deposition layer includes a gradient resistivity which includes a high impedance layer region which has a resistivity at least greater than 1500 ohm-cm;
    wherein the high impedance layer region is a part of the deposition layer, and the doping concentration of the deposition layer is less than $10^{12}$ atom/cm$^3$.

2. The epitaxial substrate of claim 1, wherein the gradient resistivity has a maximum value at the first surface of the deposition layer.

3. The epitaxial substrate of claim 1, wherein a thickness of the high impedance layer region is smaller than or equal to 6 μm.

4. The epitaxial substrate of claim 1, wherein a thickness of the high impedance layer region is smaller than or equal to 2 μm.

5. The epitaxial substrate of claim 1, wherein a resistivity of the high impedance layer region is greater than 7000 ohm-cm.

6. The epitaxial substrate of claim 1, wherein the gradient doping concentration of the deposition layer decreases from the second surface to the first surface.

7. The epitaxial substrate of claim 1, wherein the dopants of the deposition layer and the substrate are the same.

8. The epitaxial substrate of claim 1, wherein the deposition layer at least includes a first stacked layer and a second stacked layer, wherein the first stacked layer is disposed on the substrate and between the substrate and the second stacked layer; the second stacked layer is disposed on the first stacked layer.

9. The epitaxial substrate of claim 8, wherein a doping concentration of the first stacked layer is smaller than or equal to that of the substrate.

10. The epitaxial substrate of claim 8, wherein the dopants of the first stacked layer and the substrate are different.

11. The epitaxial substrate of claim 8, wherein the dopants of the first stacked layer and the second stacked layer are different.

12. The epitaxial substrate of claim 8, wherein the gradient resistivity has a maximum at the first surface of the deposition layer which contacts with the buffer layer.

13. The epitaxial substrate of claim 1, wherein the substrate is a heavily doped substrate and the doping concentration is equal to or greater than $1\times10^{18}$ atom/cm$^3$.

14. The epitaxial substrate of claim 8, wherein the substrate is a heavily doped substrate and the doping concentration is equal to or greater than $1\times10^{18}$ atom/cm$^3$.

15. A method for forming an epitaxial substrate, comprising:
    A. providing a substrate;
    B. forming a deposition layer on the substrate, wherein the deposition layer and the substrate are formed of homogeneous material; the deposition layer includes a gradient doping concentration and has a first surface and a second surface which are opposite to each other; the gradient doping concentration has a minimum value at the first surface; the deposition layer includes a gradient resistivity which includes a high impedance layer region having a resistivity at least greater than 1500 ohm-cm; the doping concentration of the deposition layer is less than $10^{12}$ atom/cm$^3$;
    C. forming a buffer layer on the deposition layer; and
    D. forming an epitaxial layer on the buffer layer, wherein the epitaxial layer is mainly formed of group III-V nitride.

16. The method of claim 15, wherein the gradient doping concentration of the deposition layer decreases toward the first surface.

17. The method of claim 15, wherein the dopants of the deposition layer and the substrate are the same.

18. The method of claim 15, wherein the deposition layer at least includes a first stacked layer and a second stacked layer; the first stacked layer is formed on the substrate first, and the second stacked layer is formed on the first stacked layer in step B.

19. The method of claim 18, wherein a doping concentration of the first stacked layer is smaller than or equal to that of the substrate.

20. The method of claim 18, wherein the dopants of the first stacked layer and the substrate are different.

21. The method of claim 18, wherein the dopants of the first stacked layer and the second stacked layer are different.

22. The method of claim 15, wherein the substrate is a heavily doped substrate having a doping concentration which is equal to or greater than $1\times10^{18}$ atom/cm$^3$.

23. The method of claim 18, wherein the substrate is a heavily doped substrate having a doping concentration which is equal to or greater than $1\times10^{18}$ atom/cm$^3$.

* * * * *